United States Patent
Lee et al.

(10) Patent No.: US 9,264,010 B2
(45) Date of Patent: Feb. 16, 2016

(54) VIA STRUCTURE HAVING OPEN STUB AND PRINTED CIRCUIT BOARD HAVING THE SAME

(71) Applicant: Samsung Electro-Mechanics Co., Ltd., Suwon (KR)

(72) Inventors: Dong Hwan Lee, Suwon (KR); Seung Wook Park, Seoul (KR); Christian Romero, Suwon (KR); Young Do Kweon, Suwon (KR); Jin Gu Kim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 187 days.

(21) Appl. No.: 14/027,835

(22) Filed: Sep. 16, 2013

(65) Prior Publication Data

US 2014/0077896 A1    Mar. 20, 2014

(30) Foreign Application Priority Data

Sep. 18, 2012  (KR) .................. 10-2012-0103421

(51) Int. Cl.
*H03H 7/01*    (2006.01)
*H05K 1/02*    (2006.01)
*H05K 1/11*    (2006.01)

(52) U.S. Cl.
CPC ............... *H03H 7/17* (2013.01); *H05K 1/0251* (2013.01); *H05K 1/116* (2013.01); *H05K 2201/09381* (2013.01)

(58) Field of Classification Search
CPC . H03H 17/17; H03H 17/1741; H05K 1/0251; H05K 1/116
USPC .......................................................... 333/33
See application file for complete search history.

(56) References Cited

U.S. PATENT DOCUMENTS

| | | | |
|---|---|---|---|
| 6,933,450 B2 * | 8/2005 | Okumichi et al. | 174/264 |
| 8,085,112 B2 * | 12/2011 | Kushta et al. | 333/33 |
| 2002/0130737 A1 * | 9/2002 | Hreish et al. | 333/204 |
| 2006/0125573 A1 | 6/2006 | Brunette et al. | |
| 2007/0279880 A1 * | 12/2007 | Weir et al. | 361/794 |
| 2008/0093112 A1 | 4/2008 | Kushta | |

FOREIGN PATENT DOCUMENTS

| | | |
|---|---|---|
| JP | 2004-335690 | 11/2004 |
| JP | 2008-541484 | 11/2008 |
| KR | 10-0800488 | 2/2008 |

* cited by examiner

*Primary Examiner* — Stephen E Jones
*Assistant Examiner* — Scott S Outten
(74) *Attorney, Agent, or Firm* — NSIP Law

(57) ABSTRACT

The present invention relates to a via structure having an open stub and a printed circuit board having the same. In accordance with an embodiment of the present invention, a via structure having an open stub including: a signal transmission via passing through an insulating layer; upper and lower via pads for connecting first and second transmission lines, which are respectively formed on and under the insulating layer, and the signal transmission via; and at least one open stub connected to an outer periphery of each via pad to have a shunt capacitance with each ground pattern formed on and under the insulating layer is provided. Further, a printed circuit board with a via having an open stub is provided.

12 Claims, 6 Drawing Sheets

45  31  10  20  15  45

- PRIOR ART -

- PRIOR ART -

VIA STRUCTURE HAVING OPEN STUB AND PRINTED CIRCUIT BOARD HAVING THE SAME

CROSS-REFERENCE TO RELATED APPLICATIONS

This application claims the foreign priority benefit of Korean Patent Application No. 10-2012-0103421, filed Sep. 18, 2012, the contents of which are incorporated herein by reference.

BACKGROUND OF THE INVENTION

1. Field of the Invention

The present invention relates to a via structure having an open stub and a printed circuit board having the same, and more particularly, to a via structure having an open stub that has an open stub connected to a via pad, and a printed circuit board having the same.

2. Description of the Related Art

As the transmission rate of mobile devices such as PCs, mobile phones, and tablet PCs and the data rate increase, the amount of data transmitted through a circuit board and the usable frequency are also increasing.

Conventional signal transmission via in a substrate and circuit board have a structure in which a via passing through an insulating layer is connected between a first transmission line for receiving a signal and a second transmission line for outputting a signal through a via pad.

The longer the line and the higher the frequency, the greater the transmission loss value of a signal transmission channel of the circuit board having the conventional via and via pad, and return loss characteristics are also deteriorated due to specific impedance discontinuity occurring in the via and so on.

The characteristics of the conventional signal transmission channel will be described with reference to FIGS. 7 and 8.

FIG. 7 is a view showing a signal transmission channel equivalent circuit in the conventional via structure and circuit board, and FIG. 8 is a graph showing signal transmission channel characteristics in the conventional via structure and circuit board in accordance with FIG. 7.

FIG. 7 is a channel equivalent circuit of the conventional via pad structure, and a resistor R1 and L1 between transmission lines represent equivalent resistance and inductance of the via. In the via having the conventional via pad, since a capacitance between a top via pad without an open stub and a ground plane and a capacitance between the top via pad and an inner layer upper via pad are negligibly low, they can be omitted from the equivalent circuit, and a capacitance between a bottom via pad and the ground plane and a capacitance between an inner layer lower via pad and the bottom via pad are the same. In the signal transmission channel having the conventional via pad, as shown in FIG. 8, as the frequency increases, the loss increases and the return loss characteristics are deteriorated.

RELATED ART DOCUMENT

Patent Document

Patent Document 1: U.S. Patent Laid-open Publication No. US20080093112 (laid-open on Apr. 24, 2008)

SUMMARY OF THE INVENTION

The present invention has been invented in order to overcome the above-described problems and it is, therefore, an object of the present invention to provide a via structure having an open stub for improving transmission loss and return loss characteristics of a signal by adding an open stub to a via pad.

In accordance with a first embodiment of the present invention to achieve the object, there is provided a via structure having an open stub including: a signal transmission via passing through an insulating layer; upper and lower via pads for connecting first and second transmission lines, which are respectively formed on and under the insulating layer, and the signal transmission via; and at least one open stub connected to an outer periphery of each via pad to have a shunt capacitance with each ground pattern formed on and under the insulating layer.

At this time, in an example, the signal transmission via may pass through the insulating layer including a core insulating layer, an upper insulating layer, and a lower insulating layer, the at least one open stub connected to the outer periphery of the upper via pad formed on the upper insulating layer may have a shunt capacitance with an upper ground pattern formed on the upper insulating layer and an inner layer upper ground pattern formed on the core insulating layer and under the upper insulating layer, and the at least one open stub connected to the outer periphery of the lower via pad formed on the lower insulating layer may have a shunt capacitance with a lower ground pattern formed on the lower insulating layer and an inner layer lower ground pattern formed under the core insulating layer and on the lower insulating layer.

Further, in an example, a portion of the inner layer upper ground pattern may be disposed directly under an end of the open stub connected to the outer periphery of the upper via pad, and a portion of the inner layer upper ground pattern may be disposed directly on an end of the open stub connected to the outer periphery of the lower via pad.

In another example, the signal transmission via may include a core via portion passing through the core insulating layer, an upper via portion passing through the upper insulating layer, and a lower via portion passing through the lower insulating layer, the upper via pad may connect the first transmission line formed on the upper insulating layer and the upper via portion, the lower via pad may connect the second transmission line formed on the lower insulating layer and the lower via portion, and inner layer upper and inner layer lower via pads may connect the upper and lower via portions and the core via portion while being formed on and under the core insulating layer.

Further, in accordance with an example, the open stub may have a rectangular or fan shape.

In another example, the via structure having an open stub may implement a low-pass filter by having a shunt capacitance due to the at least one open stub.

At this time, in another example, an operation frequency of the low-pass filter may be adjusted by adjusting a line width and a length of the open stub.

Next, in accordance with a second embodiment of the present invention to achieve the object, there is provided a printed circuit board with a via having an open stub including: an insulating layer; a signal transmission via passing through the insulating layer; first and second transmission lines respectively formed on and under the insulating layer; ground patterns respectively formed on and under the insulating layer to be spaced apart from the first and second transmission lines; and at least one open stub connected to an outer periphery of each via pad for connecting each of the first and second transmission lines and the signal transmission via to have a shunt capacitance with each ground pattern on and under the insulating layer.

At this time, in an example, the insulating layer may include a core insulating layer, an upper insulating layer disposed on the core insulating layer, and a lower insulating layer disposed under the core insulating layer, the first transmission line may be formed on the upper insulating layer and the second transmission line may be formed on the lower insulating layer, an upper ground pattern may be formed on the upper insulating layer to be spaced apart from the first transmission line and a lower ground pattern may be formed on the lower insulating layer to be spaced apart from the second transmission line, an inner layer upper ground pattern may be formed on the core insulating layer and under the upper insulating layer and an inner layer lower ground pattern may be formed under the core insulating layer and on the lower insulating layer, the at least one open stub connected to the outer periphery of an upper via pad formed on the upper insulating layer may have a shunt capacitance with the upper ground pattern and the inner layer upper ground pattern, and the at least one open stub connected to the outer periphery of a lower via pad formed on the lower insulating layer may have a shunt capacitance with the lower ground pattern and the inner layer lower ground pattern.

Further, in accordance with an example, a portion of the inner layer upper ground pattern may be disposed directly under an end of the open stub connected to the outer periphery of the upper via pad, and a portion of the inner layer upper ground pattern may be disposed directly on an end of the open stub connected to the outer periphery of the lower via pad.

In another example, the signal transmission via may include a core via portion passing through the core insulating layer, an upper via portion passing through the upper insulating layer, and a lower via portion passing through the lower insulating layer, the upper via pad may connect the first transmission line formed on the upper insulating layer and the upper via portion, the lower via pad may connect the second transmission line formed on the lower insulating layer and the lower via portion, and inner layer upper and inner layer lower via pads may connect the upper and lower via portions and the core via portion while being formed on and under the core insulating layer.

Further, in accordance with an example, the open stub may have a rectangular or fan shape.

In another example, the printed circuit board may implement a low-pass filter by having a shunt capacitance due to the at least one open stub.

At this time, in accordance with another example, an operation of the low-pass filter may be adjusted by adjusting a line width and a length of the open stub.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 3b is an enlarged view of a portion A of FIG. 3a;

DETAILED DESCRIPTION OF THE PREFERABLE EMBODIMENTS

Figure 1:
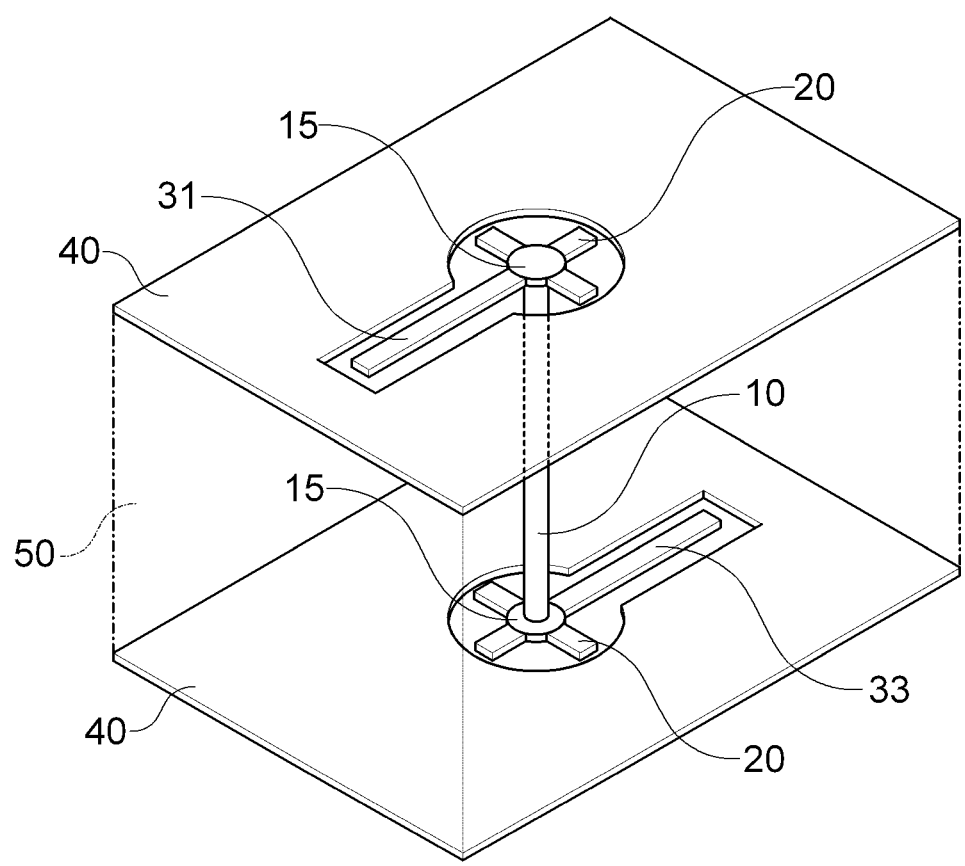
FIG. 1 is a view schematically showing a via structure having an open stub and a printed circuit board with a via having an open stub in accordance with an embodiment of the present invention.

Embodiments of the present invention to achieve the above-described objects will be described with reference to the accompanying drawings. In this description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other elements or combination thereof.

The drawings referenced in this specification are provided as examples to describe the embodiments of the present invention, and the shape, the size, and the thickness may be exaggerated in the drawings for effective description of technical features.

First, a via structure in a printed circuit board in accordance with an embodiment of the present invention will be specifically described with reference to the drawings. At this time, the reference numeral that is not mentioned in the reference drawing may be the reference numeral that represents the same element in another drawing.

Figure 2:
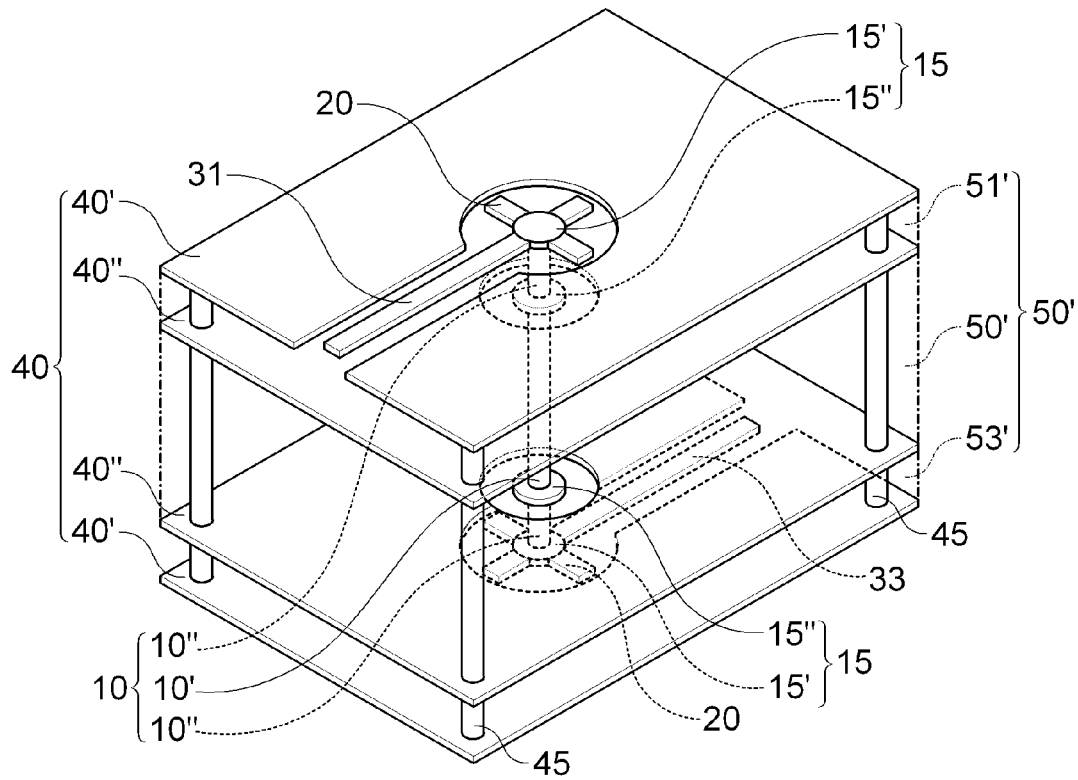
FIG. 2 is a view schematically showing a via structure having an open stub and a printed circuit board with a via having an open stub in accordance with another embodiment of the present invention.
Figure 3A:
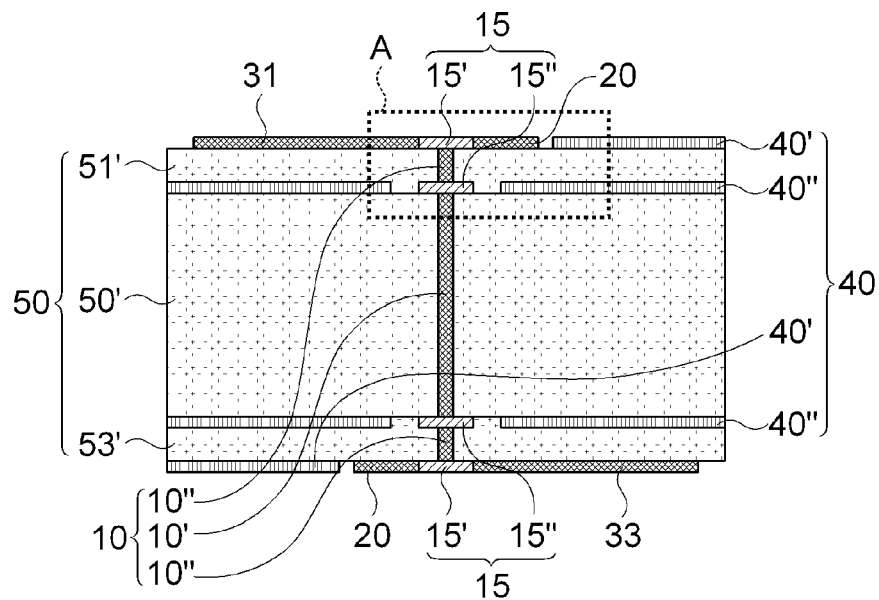
FIG. 3a is a cross-sectional view schematically showing the via structure having an open stub and the printed circuit board with a via having an open stub in accordance with another embodiment of the present invention.
Figure 3B:
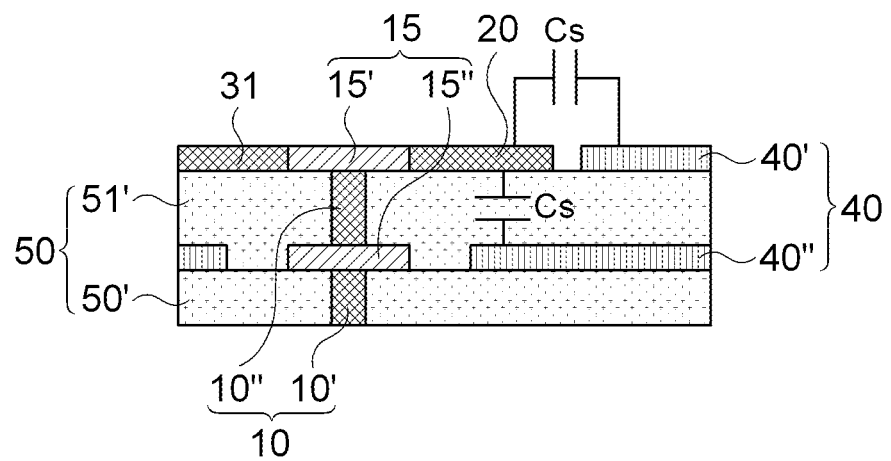
Figure 4A:
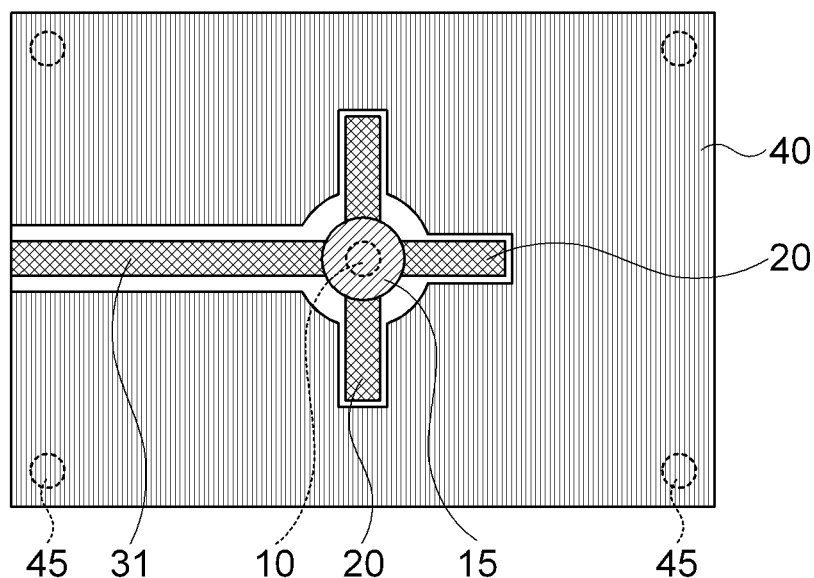
FIGS. 4a and 4b are views schematically showing examples of the open stub in the via structure and the printed circuit board in accordance with another embodiment of the present invention.
Figure 4B:
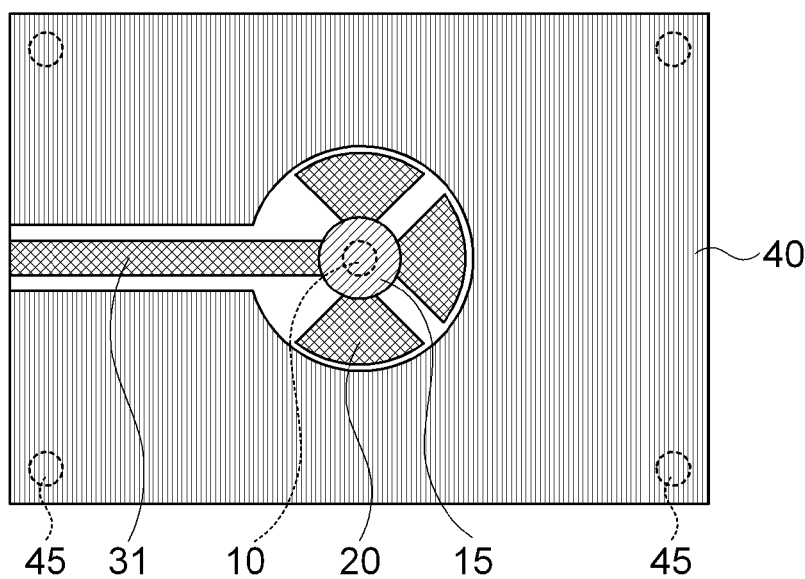
Figure 5:
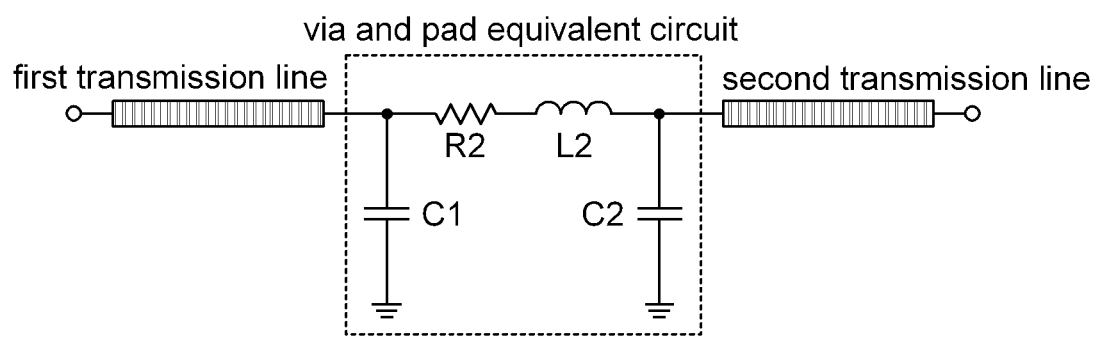
FIG. 5 is a view showing a signal transmission channel equivalent circuit in the via structure having an open stub and the printed circuit board with a via having an open stub in accordance with an embodiment of the present invention.
Figure 6:
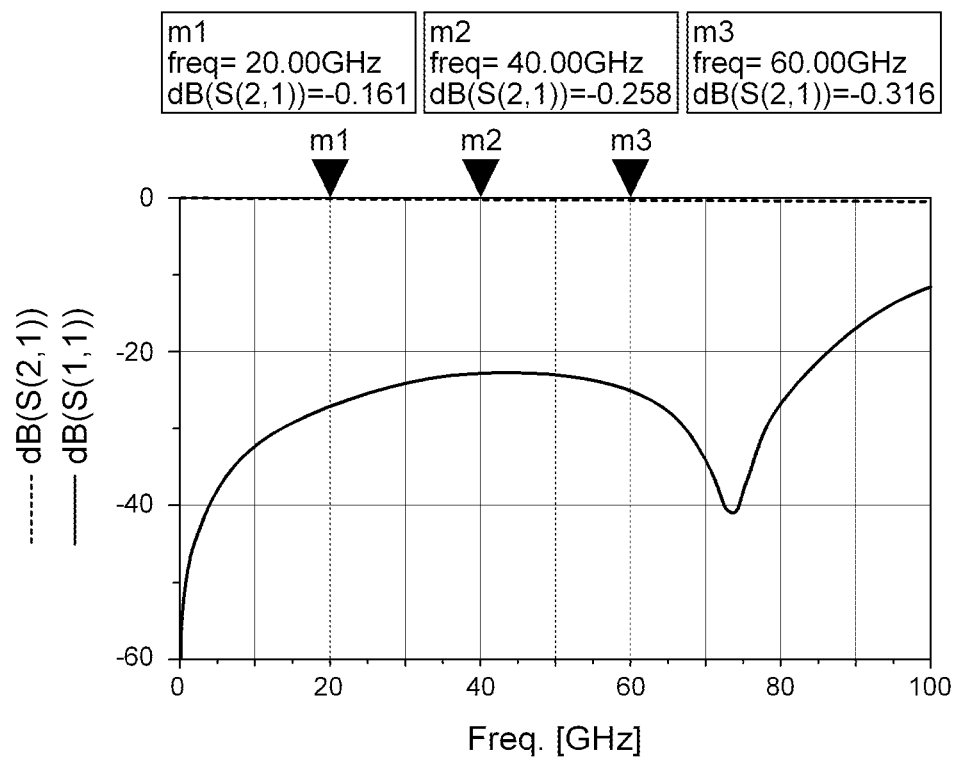
FIG. 6 is a graph showing signal transmission channel characteristics in the via structure having an open stub and the printed circuit board with a via having an open stub in accordance with an embodiment of the present invention.
Figure 7:
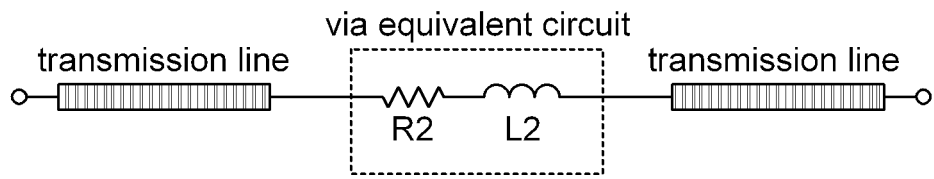
FIG. 7 is a view showing a signal transmission channel equivalent circuit in conventional via structure and printed circuit board.

FIG. 1 is a view schematically showing a via structure having an open stub and a printed circuit board with a via having an open stub in accordance with an embodiment of the present invention, FIG. 2 is a view schematically showing a via structure having an open stub and a printed circuit board with a via having an open stub in accordance with another embodiment of the present invention, FIG. 3a is a cross-sectional view schematically showing the via structure having an open stub and the printed circuit board with a via having an open stub in accordance with another embodiment of the present invention, FIG. 3b is an enlarged view of a portion A of FIG. 3a, FIGS. 4a and 4b are views schematically showing examples of the open stub in the via structure and the printed circuit board in accordance with another embodiment of the present invention, FIG. 5 is a view showing a signal transmission channel equivalent circuit in the via structure having an open stub and the printed circuit board having with a via having an open stub in accordance with an embodiment of the present invention, and FIG. 6 is a graph showing signal transmission channel characteristics in the via structure having an open stub and the printed circuit board with a via having an open stub in accordance with an embodiment of the present invention.

Referring to FIGS. 1, 2, and 3a, a via structure having an open stub in accordance with an example includes a signal transmission via 10, upper and lower via pads 15', and at least one open stub 20.

At this time, the signal transmission via 10 passes through an insulating layer 50 of a printed circuit board. At this time, the signal transmission via 10 transmits a signal from a first transmission line 31 formed on the insulating layer 50 to a second transmission line 33 formed under the insulating layer 50. For example, referring to FIG. 5, serial connection of a resistor R2 and an inductance L2 between the first transmission line 31 and the second transmission line 33 may be an equivalent circuit of the signal transmission via 10. At this time, the inductance L2 may be determined by a diameter $\phi$ and a length L of the via 10. Further, a distance between the first transmission line 31 and the second transmission line 33 is sufficiently far due to a thickness of the insulating layer 50, a capacitance therebetween can be ignored.

Next, referring to FIGS. 1, 2, and 3a, the upper and lower via pads 15' connect the first and second transmission lines 31 and 33, which are respectively formed on and under the insulating layer 50, and the signal transmission via 10. That is, the upper via pad 15' connects the first transmission line 31, which is formed on the insulating layer 50, and the signal transmission via 10, and the lower via pad 15' connects the signal transmission via 10 and the second transmission line 33 formed under the insulating layer 50.

Continuously, the open stub 20 will be described with reference to FIGS. 1, 2, and 3a. The at least one open stub 20 is connected to an outer periphery of each via pad 15' to have a shunt capacitance with each ground pattern 40 and 40' formed on and under the insulating layer 50. That is, referring to FIG. 3b, the at least one open stub 20 connected to the upper via pad 15' has a shunt capacitance with an upper ground pattern 40' formed on the insulating layer 50, and the at least one open stub 20 has a shunt capacitance with a lower ground pattern 40' formed under the insulating layer 50. For example, in the signal transmission channel equivalent circuit of FIG. 5, the shunt capacitance between the open stub 20 connected to the upper via pad 15' and the upper ground pattern 40' may be C1, and the shunt capacitance between the open stub 20 connected to the lower via pad 15' and the lower ground pattern 40' may be C2.

For example, although not shown, when the open stub 20 connected to the via pad 15' is one, the open stub 20 may be connected to the via pad 15' symmetrically to the direction of the transmission line, and when the open stubs 20 are two, for example, the open stubs 20 may be connected to the via pad 15' to form an angle of 120 degrees with the transmission line, or as shown in FIGS. 1, 2, 4a, and 4b, when the open stubs 20 are three, the open stubs 20 may be connected to the via pad 15' at intervals of 90 degrees. Further, the number of the open stubs may be greater than four.

For example, the open stub 20 may have a rectangular or fan shape or other shapes. For example, referring to FIGS. 1 and 4a, the open stub 20 may have a rectangular shape, and referring to FIG. 4b, the open stub 20 may have a fan shape. At this time, looking into the shape of the ground pattern 40, for example, as in FIGS. 1 and 4b, the ground pattern 40 may surround a combination of the via pad 15' and the open stub 20 in the form of a partially open circle, or as shown in FIG. 4a, the ground pattern 40 may be spaced apart from the open stub 20 by a predetermined interval and formed similar to the shape of the combination of the via pad 15' and the open stub 20.

For example, a distance between an end of the open stub 20 and the ground pattern 40 and 40' formed around the open stub 20 may be shorter than that between the outer periphery of the via pad 15' and the ground pattern 40 and 40', and a slit may be formed between the end of the open stub 20 and the ground pattern 40 and 40' formed around the open stub 20.

Further, referring to FIG. 5, the via structure having an open stub in accordance with an example can implement a low-pass filter by having a shunt capacitance due to the at least one open stub 20. At this time, it is possible to adjust an operation frequency of the low-pass filter by adjusting a line width and a length of the open stub 20. For example, referring to FIG. 5, a pi ($\pi$) type low-pass filter (LPF) can be formed by the structure of the signal transmission via 10, the via pad 15', and the open stub 20, and an operation frequency of the LPF can be adjusted by adjusting the length and width of the open stub 20 to adjust the shunt capacitances C1 and C2.

Next, another example will be described with reference to FIGS. 2, 3a, and 3b.

Referring to FIGS. 2 and 3a, like FIG. 1, a via structure having an open stub includes a signal transmission via 10, upper and lower via pads 15', and at least one open stub 20. At this time, the signal transmission via 10 passes through an insulating layer 50 including a core insulating layer 50', an upper insulating layer 51' disposed on the core insulating layer 50', and a lower insulating layer 53' disposed under the core insulating layer 50'. Referring to FIG. 3a, even at this time, like the example of FIG. 1, the at least one open stub 20 connected to the upper via pad 15' has a shunt capacitance with an upper ground pattern 40' formed on the insulating layer 50, and the at least one open stub 20 connected to the lower via pad 15' has a shunt capacitance with a lower ground pattern 40' formed under the insulating layer 50. For example, a distance between an end of the open stub 20 and the ground pattern 40' formed around the open stub 20 may be shorter than that between an outer periphery of the via pad 15' and the ground pattern 40'.

For example, referring to FIGS. 4a and 4b, the open stub 20 may have a rectangular or fan shape or other shapes.

Further, referring to FIG. 5, a pi ($\pi$) type low-pass filter (LPF) may be formed by the structure of the signal transmission via 10, the via pad 15', and the open stub 20. At this time, the shunt capacitance between the open stub 20 connected to the upper via pad 15' and the upper ground pattern 40' and an inner layer upper ground pattern 40" may be C1, and the shunt capacitance between the open stub 20 connected to the lower via pad 15' and the lower ground pattern 40' and an inner layer lower ground pattern 40" may be C2.

Further, referring to FIGS. 2, 3a, 3b, and 5, the at least one open stub 20 connected to the outer periphery of the upper via pad 15' formed on the upper insulating layer 51' has a shunt capacitance Cs (refer to C1 of FIG. 5) with the upper ground pattern 40' formed on the upper insulating layer 51' and the inner layer upper ground pattern 40" formed on the core insulating layer 50' and under the upper insulating layer 51'.

In addition, the at least one open stub 20 connected to the outer periphery of the lower via pad 15' formed on the lower insulating layer 53' has a shunt capacitance (refer to Cs of FIG. 3b and C2 of FIG. 5) with the lower ground pattern 40' formed on the lower insulating layer 53' and the inner layer lower ground pattern 40" formed under the core insulating layer 50' and on the lower insulating layer 53'.

For example, referring to FIGS. 2, 3a, and 3b, the upper and lower insulating layers 51' and 53' may have a smaller thickness than the core insulating layer 50' so that the open stub 20 connected to the outer periphery of the upper via pad 15' has a shunt capacitance Cs with the inner layer upper ground pattern 40" and the open stub 20 connected to the outer periphery of the lower via pad 15' has a shunt capacitance (refer to Cs of FIG. 3b) with the inner layer lower ground pattern 40". In FIGS. 3b and 5, by the upper and lower insulating layers 51' and 53' having a small thickness, a significant shunt capacitance is formed between the open stub 20 connected to the upper via pad 15' and the inner layer upper ground pattern 40" and between the open stub 20 connected to the lower via pad 15' and the inner layer lower ground pattern 40". Due to the sufficient thickness of the core insulating layer 50', capacitances between a first transmission line 31 and a second transmission line 33, between the open stub 20 connected to the upper via pad 15' and the inner layer lower and lower ground patterns 40', and between the open stub 20 connected to the lower via pad 15' and the inner layer upper and upper ground patterns 40' can be ignored.

Further, referring to FIGS. 3a and 3b, in an example, a portion of the inner layer upper ground pattern 40" is disposed directly under the end of the open stub 20 connected to the outer periphery of the upper via pad 15', and a portion of the inner layer upper ground pattern 40" may be disposed directly on the end of the open stub 20 connected to the outer periphery of the lower via pad 15'. Accordingly, a shunt capacitance can be formed between the open stub 20 connected to the upper via pad 15' and the inner layer upper ground pattern 40" and between the open stub 20 connected to the lower via pad 15' and the inner layer lower ground pattern 40".

Further, referring to FIGS. 2 and 3a, in an example, the signal transmission via 10 includes a core via portion passing through the core insulating layer 50', an upper via portion passing through the upper insulating layer 51', and a lower via portion passing through the lower insulating layer 53'. Further, referring to FIGS. 2 and 3a, the upper via pad 15' connects the first transmission line 31 formed on the upper insulating layer 51' and the upper via portion, the lower via pad 15' connects the second transmission line 33 formed on the lower insulating layer 53' and the lower via portion, and inner layer upper and inner layer lower via pads 15" may be further formed to connect the upper and lower via portions and the core via portion while being formed on and under the core insulating layer 50'.

Next, a printed circuit board with a via having an open stub 20 in accordance with a second embodiment of the present invention will be specifically described with reference to the drawings. At this time, the via structure having an open stub in accordance with the first embodiment described above will be referenced. Thus, repeated descriptions may be omitted FIG. 1 is a view schematically showing a printed circuit board with a via having an open stub 20 in accordance with an embodiment of the present invention, FIG. 2 is a view schematically showing a printed circuit board with a via having an open stub 20 in accordance with another embodiment of the present invention, FIG. 3a is a cross-sectional view schematically showing the printed circuit board with a via having an open stub 20 in accordance with another embodiment of the present invention, FIG. 3b is an enlarged view of a portion A of FIG. 3a, FIGS. 4a and 4b are views schematically showing examples of the open stub 20 in the printed circuit board in accordance with another embodiment of the present invention, FIG. 5 is a view showing a signal transmission channel equivalent circuit in the printed circuit board with a via having an open stub 20 in accordance with an embodiment of the present invention, and FIG. 6 is a graph showing signal transmission channel characteristics in the printed circuit board with a via having an open stub 20 in accordance with an embodiment of the present invention.

Referring to FIGS. 1, 2, and 3a, a printed circuit board with a via having an open stub 20 in accordance with an example includes an insulating layer 50, a signal transmission via 10, first and second transmission lines 31 and 33, a ground pattern 40 and 40', and an open stub 20.

At this time, the insulating layer 50 may be formed using an insulating material used in a printed circuit board.

Next, referring to FIGS. 1, 2, and 3a, the signal transmission line 10 passes through the insulating layer 50 of the printed circuit board. For example, referring to FIG. 5, serial connection of a resistor R2 and an inductance L2 between the first transmission line 31 and the second transmission line 33 may be an equivalent circuit of the signal transmission via 10. At this time, the inductance L2 may be determined by a diameter φ and a length L of the via.

Next, referring to FIGS. 1, 2, and 3a, the first transmission line 31 is formed on the insulating layer 50, and the second transmission line 33 is formed under the insulating layer 50. At this time, the signal transmission via 10 transmits a signal from the first transmission line 31 formed on the insulating layer 50 to the second transmission line 33 formed under the insulating layer 50. For example, referring to FIG. 5, a distance between the first transmission line 31 and the second transmission line 33 is sufficiently far due to a thickness of the insulating layer 50, a capacitance therebetween can be ignored.

Further, referring to FIGS. 1, 2, and 3a, an upper ground pattern 40' is formed on the insulating layer 50 to be spaced apart from the first transmission line 31, and a lower ground pattern 40' is formed under the insulating layer 50 to be spaced apart from the second transmission line 33.

Continuously, the open stub 20 in the printed circuit board in accordance with the present embodiment will be described with reference to FIGS. 1, 2, and 3a. At least one open stub 20 is connected to outer peripheries of the via pads 15' which are respectively formed on and under the insulating layer 50. At this time, the at least one open stub 20 is connected to the outer periphery of each via pad 15' to have a shunt capacitance with the respective ground patterns 40 and 40' on and under the insulating layer 50 where the via pads 15 are formed. That is, referring to FIG. 3b, the at least one open stub 20 connected to the upper via pad 15' has a shunt capacitance between the upper ground pattern 40' formed on the insulating layer 50, and the at least one open stub 20 connected to the lower via pad 15' has a shunt capacitance with the lower ground pattern 40' formed under the insulating layer 50.

For example, in the signal transmission channel equivalent circuit of FIG. 5, the shunt capacitance between the open stub 20 connected to the upper via pad 15' and the upper ground pattern 40' may be C1, and the shunt capacitance between the open stub 20 connected to the lower via pad 15' and the lower ground pattern 40' may be C2.

At this time, referring to FIGS. 1, 2, and 3a, the upper via pad 15' to which the at least one open stub 20 is connected connects the first transmission line 31 formed on the insulating layer 50 and the signal transmission via 10, and the lower via pad 15' to which the at least one open stub 20 is connected connects the signal transmission via 10 and the second transmission line 33 formed under the insulating layer 50.

For example, although not shown, when the open stub 20 connected to the via pad 15' is one, the open stub 20 may be connected to the via pad 15' symmetrically to the direction of the transmission line, and when the open stubs 20 are two, for example, the open stubs 20 may be connected to the via pad 15' to form an angle of 120 degrees with the transmission line, or as shown in FIGS. 1, 2, 4a, and 4b, when the open stubs 20 are three, the open stubs 20 may be connected to the via pad 15' at intervals of 90 degrees. Further, the number of the open stubs 20 may be greater than four.

Further, for example, referring to FIGS. 1 and 4a, the open stub 20 may have a rectangular or fan shape or other shapes although not shown.

Further, in an example, a distance between an end of the open stub 20 and the ground pattern 40 and 40' formed around the open stub 20 may be shorter than that between the outer periphery of the via pad 15' and the ground pattern 40 and 40', and a slit may be formed between the end of the open stub 20 and the ground pattern 40 and 40' formed around the open stub 20.

Further, referring to FIG. 5, the printed circuit board with a via having an open stub in accordance with an example can implement a low-pass filter by having a shunt capacitance due to the at least one open stub 20. At this time, it is possible to adjust an operation frequency of the low-pass filter by adjusting a line width and a length of the open stub 20. For example, referring to FIG. 5, a pi (π) type low-pass filter (LPF) can be formed by the structure of the signal transmission via 10, the via pad 15', and the open stub 20, and an operation frequency of the LPF can be adjusted by adjusting the length and width of the open stub 20 to adjust the shunt capacitances C1 and C2.

A printed circuit board with a via having an open stub 20 in accordance with another example will be described with reference to FIGS. 2 and 3a. At this time, an insulating layer 50 may include a core insulating layer 50', an upper insulating layer 51' disposed on the core insulating layer 50', and a lower insulating layer 53' disposed under the core insulating layer 50'. At this time, a first transmission line 31 is formed on the upper insulating layer 51', and a second transmission line 33 is formed on the lower insulating layer 53'.

Further, referring to FIGS. 2 and 3a, an upper ground pattern 40' is formed on the upper insulating layer 51' to be spaced apart from the first transmission line 31, a lower ground pattern 40' is formed on the lower insulating layer 53' to be spaced apart from the second transmission line 33, an inner layer upper ground pattern 40" is formed on the core insulating layer 50' and under the upper insulating layer 51', and an inner layer lower ground pattern 40" is formed under the core insulating layer 50' and on the lower insulating layer 53'. For example, a ground via 45 may connect between the ground patterns 40.

In addition, referring to FIGS. 2, 3a, 3b, and 5, at least one open stub 20 connected to an outer periphery of an upper via pad 15' formed on the upper insulating layer 51' has a shunt capacitance Cs (refer to C1 of FIG. 5) with the upper ground pattern 40' and the inner layer upper ground pattern 40". Further, at least one open stub 20 connected to an outer periphery of a lower via pad 15' formed on the lower insulating layer 53' has a shunt capacitance (refer to Cs of FIG. 3b and C2 of FIG. 5) with the lower ground pattern 40' and the inner layer lower ground pattern 40".

Referring to FIG. 5, a pi (π) type low-pass filter (LPF) can be formed by the structure of the signal transmission via 10, the via pad 15', and the open stub 20 of the printed circuit board with a via having an open stub in accordance with the present embodiment, and an operation frequency of the LPF can be adjusted by adjusting the length and width of the open stub 20 to adjust the shunt capacitances C1 and C2.

For example, referring to FIGS. 2, 3a, and 3b, the upper and lower insulating layers 51' and 53' may have a smaller thickness than the core insulating layer 50' so that the open stub 20 connected to the outer periphery of the upper via pad 15' has a shunt capacitance Cs with the inner layer upper ground pattern 40" and the open stub 20 connected to the outer periphery of the lower via pad 15' has a shunt capacitance (refer to Cs of FIG. 3b) with the inner layer lower ground pattern 40". For example, in FIGS. 3b and 5, by the upper and lower insulating layers 51' and 53' having a small thickness, a significant shunt capacitance is formed between the open stub 20 connected to the upper via pad 15' and the inner layer upper ground pattern 40" and between the open stub 20 connected to the lower via pad 15' and the inner layer lower ground pattern 40". Due to the sufficient thickness of the core insulating layer 50', capacitances between the first transmission line 31 and the second transmission line 33, between the open stub 20 connected to the upper via pad 15' and the inner layer lower and lower ground patterns 40', and between the open stub 20 connected to the lower via pad 15' and the inner layer upper and upper ground patterns 40' can be ignored.

Further, referring to FIGS. 3a and 3b, in an example, a portion of the inner layer upper ground pattern 40" is disposed directly under an end of the open stub 20 connected to the outer periphery of the upper via pad 15', and a portion of the inner layer upper ground pattern 40" may be disposed directly on an end of the open stub 20 connected to the outer periphery of the lower via pad 15'. Accordingly, a shunt capacitance can be formed between the open stub 20 connected to the upper via pad 15' and the inner layer upper ground pattern 40" and between the open stub 20 connected to the lower via pad 15' and the inner layer lower ground pattern 40".

Further, referring to FIGS. 2 and 3a, in an example, the signal transmission via 10 includes a core via portion passing through the core insulating layer 50', an upper via portion passing through the upper insulating layer 51', and a lower via portion passing through the lower insulating layer 53'. Further, referring to FIGS. 2 and 3a, the upper via pad 15' connects the first transmission line 31 formed on the upper insulating layer 51' and the upper via portion, the lower via pad 15' connects the second transmission line 33 formed on the lower insulating layer 53' and the lower via portion, and inner layer upper and inner layer lower via pads 15" connect the upper and lower via portions and the core via portion while being formed on and under the core insulating layer 50'.

Next, signal transmission channel characteristics in the via structure having an open stub and the printed circuit board with a via having an open stub in accordance with the embodiments of the present invention will be described.

FIG. 5 is a view showing a signal transmission channel equivalent circuit in the via structure having an open stub and the printed circuit board with a via having an open stub 20 in accordance with an embodiment of the present invention. At this time, in FIG. 5, a resistor R2 and L2 represent equivalent resistance and inductance of the via, and capacitors C1 and C2 represent equivalent shunt capacitances generated in the open stubs 20 connected to the upper and lower via pads 15'.

FIG. 6 is a graph showing signal transmission channel characteristics in the via structure having an open stub and the printed circuit board with a via having an open stub 20 in accordance with an embodiment of the present invention. A transmission channel in the via structure having an open stub 20 and the printed circuit board shown in the present invention exhibits transmission characteristics having low-pass filter characteristics as in FIG. 6 when having the open stub 20 with appropriate length and line width.

Figure 8:
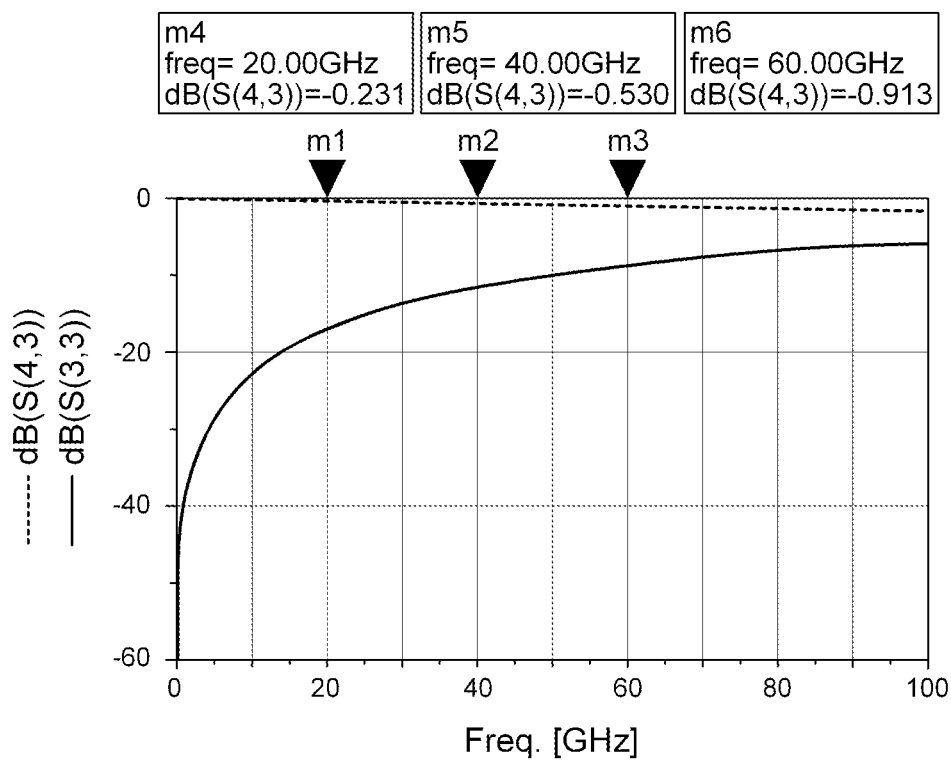
FIG. 8 is a graph showing signal transmission channel characteristics in the conventional via structure and printed circuit board according to FIG. 7.

For example, when comparing an insertion loss in FIG. 6 with an insertion loss in a channel having a conventional structure shown in FIG. 8, it is possible to check that insertion loss characteristics are improved in FIG. 6. That is, while the insertion loss is −0.161 dB in 20 GHz band, −0.258 dB in 40 GHz band, and −0.316 dB in 60 GHz band in FIG. 6, the insertion loss is −0.231 dB in 20 GHz band, −0.530 dB in 40 GHz band, and −0.913 dB in 60 GHz band in FIG. 8. Further, if comparing FIG. 6 with FIG. 8, it is possible to check that return loss characteristics are also improved. In FIG. 6, it is possible to check that a notch is formed in a high frequency band, for example, in about 72 GHz band and thus the return loss characteristics are improved.

Like this, the characteristics of the transmission channel can play a role in improving the insertion loss characteristics in a high frequency and the return loss characteristics at the same time by making a zero point in a specific frequency as shown in FIG. 6.

Therefore, it is possible to generate a transmission channel having low-pass characteristics in a specific frequency domain by checking the length and diameter of the via, calculating the equivalent circuit of the via, and adding the open stub 20 having an appropriate capacitance to the via pad 15' as shown in the present invention. Using this, it is possible to improve transmission characteristics of a signal.

According to the embodiments of the present invention, it is possible to improve transmission loss and return loss characteristics of a signal by adding the open stub to the via pad.

Further, as in the embodiments, it is possible to generate a transmission channel having low-pass characteristics in a specific frequency domain by checking the length and diameter of the via, calculating the equivalent circuit therefrom, and adding the open stub having an appropriate capacitance to the via pad. Using this, it is possible to improve transmission characteristics of a signal.

It is apparent that various effects which have not been directly mentioned according to the various embodiments of the present invention can be derived by those skilled in the art from various constructions according to the embodiments of the present invention.

The above-described embodiments and the accompanying drawings are provided as examples to help understanding of those skilled in the art, not limiting the scope of the present invention. Further, embodiments according to various combinations of the above-described components will be apparently implemented from the foregoing specific descriptions by those skilled in the art. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A via structure having an open stub, comprising:
    a signal transmission via passing through an insulating layer;
    upper and lower via pads for connecting first and second transmission lines, which are respectively formed on and under the insulating layer, and the signal transmission via; and
    at least one open stub connected to an outer periphery of each via pad to have a shunt capacitance with ground patterns formed on and under the insulating layer,
    wherein the signal transmission via passes through the insulating layer including a core insulating layer, an upper insulating layer, and a lower insulating layer,
    the at least one open stub connected to the outer periphery of the upper via pad formed on the upper insulating layer has a shunt capacitance with an upper ground pattern formed on the upper insulating layer and an inner layer uppermost ground pattern formed on the core insulating layer and under the upper insulating layer, wherein a portion of the inner layer uppermost ground pattern is disposed directly under an end of the open stub connected to the outer periphery of the upper via pad, and
    the at least one open stub connected to the outer periphery of the lower via pad formed on the lower insulating layer has a shunt capacitance with a lower ground pattern formed on the lower insulating layer and an inner layer lower lowermost ground pattern formed under the core insulating layer and on the lower insulating layer.

2. The via structure having an open stub according to claim 1, wherein the via structure implements a low-pass filter by having a shunt capacitance due to the at least one open stub.

3. The via structure having an open stub according to claim 2, wherein an operation frequency of the low-pass filter is adjusted by adjusting a line width and a length of the open stub.

4. The via structure having an open stub according to claim 1, wherein a portion of the inner layer uppermost ground pattern is disposed directly under an end of the open stub connected to the outer periphery of the upper via pad, and
    a portion of the inner layer lowermost ground pattern is disposed directly on an end of the open stub connected to the outer periphery of the lower via pad.

5. The via structure having an open stub according to claim 1, wherein the signal transmission via comprises a core via portion passing through the core insulating layer, an upper via portion passing through the upper insulating layer, and a lower via portion passing through the lower insulating layer, and
    the upper via pad connects the first transmission line formed on the upper insulating layer and the upper via portion, the lower via pad connects the second transmission line formed on the lower insulating layer and the lower via portion, and inner layer upper and inner layer lower via pads connects the upper and lower via portions and the core via portion while being formed on and under the core insulating layer.

6. The via structure having an open stub according to claim 1, wherein the open stub has a rectangular or fan shape.

7. A printed circuit board with a via having an open stub, comprising:
    an insulating layer;
    a signal transmission via passing through the insulating layer, and having upper and lower via pads;
    first and second transmission lines respectively formed on and under the insulating layer;
    ground patterns respectively formed on and under the insulating layer to be spaced apart from the first and second transmission lines; and
    at least one open stub connected to an outer periphery of each via pad for connecting each of the first and second transmission lines and the signal transmission via to have a shunt capacitance with each ground pattern on and under the insulating layer, wherein the insulating layer comprises a core insulating layer, an upper insulating layer disposed on the core insulating layer, and a lower insulating layer disposed under the core insulating layer, the first transmission line is formed on the upper insulating layer and the second transmission line is formed on the lower insulating layer, an upper ground pattern is formed on the upper insulating layer to be spaced apart from the first transmission line, a lower ground pattern is formed on the lower insulating layer to be spaced apart from the second transmission line, an inner layer uppermost ground pattern is formed on the core insulating layer and under the upper insulating layer, and an inner layer lowermost ground pattern is formed under the core insulating layer and on the lower insulating layer, wherein a portion of the inner layer uppermost ground pattern is disposed directly under an end of the open stub connected to the outer periphery of the upper via pad, the at least one open stub connected to the outer periphery of an upper via pad formed on the upper insulating layer has a shunt capacitance with the upper ground pattern and the inner layer uppermost ground pattern, and the at least one open stub connected to the outer periphery of a lower via pad formed on the lower insulating layer has a shunt capacitance with the lower ground pattern and the inner layer lowermost ground pattern.

8. The printed circuit board with a via having an open stub according to claim 7, wherein the printed circuit board implements a low-pass filter by having a shunt capacitance due to the at least one open stub.

9. The printed circuit board with a via having an open stub according to claim 8, wherein an operation of the low-pass filter is adjusted by adjusting a line width and a length of the open stub.

10. The printed circuit board with a via having an open stub according to claim 7, wherein a portion of the inner layer uppermost ground pattern is disposed directly under an end of the open stub connected to the outer periphery of the upper via pad, and a portion of the inner layer lowermost ground pattern is disposed directly on an end of the open stub connected to the outer periphery of the lower via pad.

11. The printed circuit board with a via having an open stub according to claim 7, wherein the signal transmission via comprises a core via portion passing through the core insulating layer, an upper via portion passing through the upper insulating layer, and a lower via portion passing through the lower insulating layer, and the upper via pad connects the first transmission line formed on the upper insulating layer and the upper via portion, the lower via pad connects the second transmission line formed on the lower insulating layer and the lower via portion, and inner layer upper and inner layer lower via pads connect the upper and lower via portions and the core via portion while being formed on and under the core insulating layer.

12. The printed circuit board with a via having an open stub according to claim 7, wherein the open stub has a rectangular or fan shape.

* * * * *